(12) United States Patent
Mitsuhashi et al.

(10) Patent No.: US 9,825,134 B2
(45) Date of Patent: Nov. 21, 2017

(54) LAYERED SEMICONDUCTOR HAVING BASE LAYER INCLUDING GAN SUBSTRATE

(71) Applicant: Sumitomo Electric Industries, Ltd., Osaka-shi (JP)

(72) Inventors: Fuminori Mitsuhashi, Itami (JP); Yusuke Yoshizumi, Itami (JP); Takashi Ishizuka, Itami (JP); Masaki Ueno, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/315,523

(22) PCT Filed: Jun. 2, 2015

(86) PCT No.: PCT/JP2015/065895
§ 371 (c)(1),
(2) Date: Dec. 1, 2016

(87) PCT Pub. No.: WO2015/190351
PCT Pub. Date: Dec. 17, 2015

(65) Prior Publication Data
US 2017/0207308 A1    Jul. 20, 2017

(30) Foreign Application Priority Data
Jun. 13, 2014   (JP) ................... 2014-122261

(51) Int. Cl.
*H01L 29/00* (2006.01)
*H01L 29/36* (2006.01)
(Continued)

(52) U.S. Cl.
CPC ........ *H01L 29/36* (2013.01); *H01L 21/28581* (2013.01); *H01L 29/0615* (2013.01);
(Continued)

(58) Field of Classification Search
CPC ............... H01L 29/872; H01L 29/0615; H01L 29/2003; H01L 29/66143
See application file for complete search history.

(56) References Cited

U.S. PATENT DOCUMENTS

| | | | |
|---|---|---|---|
| 2010/0244049 A1* | 9/2010 | Yamamoto | H01L 21/0465 257/77 |
| 2015/0050754 A1* | 2/2015 | Ploss | H01L 21/263 438/10 |

(Continued)

FOREIGN PATENT DOCUMENTS

| | | |
|---|---|---|
| JP | 2009-164345 A | 7/2009 |
| JP | 2009-252969 A | 10/2009 |

(Continued)

OTHER PUBLICATIONS

International Search Report in counterpart International Application No. PCT/JP2015/065895, dated Aug. 11, 2015.

*Primary Examiner* — Ngan Ngo
(74) *Attorney, Agent, or Firm* — Venable LLP; Michael A. Sartori; Laura G. Remus

(57) ABSTRACT

A layered semiconductor includes a base layer including a substrate and a buffer layer, and a drift layer which is disposed on the base layer and is made of GaN and whose conductivity type is an n-type. The drift layer has an average n-type impurity concentration of $1.5 \times 10^{16}$ cm$^{-3}$ or less in a radial direction of the substrate, and the difference between the maximum n-type impurity concentration and the minimum n-type impurity concentration is $1.5 \times 10^{15}$ cm$^{-3}$ or less.

3 Claims, 3 Drawing Sheets

(51) Int. Cl.
*H01L 29/20* (2006.01)
*H01L 29/872* (2006.01)
*H01L 29/66* (2006.01)
*H01L 21/285* (2006.01)
*H01L 29/06* (2006.01)

(52) U.S. Cl.
CPC .... *H01L 29/2003* (2013.01); *H01L 29/66143* (2013.01); *H01L 29/872* (2013.01)

(56) References Cited

U.S. PATENT DOCUMENTS

2016/0268448 A1* 9/2016 Minamisawa ........ H01L 21/283
2016/0293710 A1* 10/2016 Omori ................. H01L 29/2003

FOREIGN PATENT DOCUMENTS

| | | |
|---|---|---|
| JP | 2010-248021 A | 11/2010 |
| JP | 2013-058626 A | 3/2013 |
| WO | 2013/001014 A1 | 1/2013 |

* cited by examiner

US 9,825,134 B2

LAYERED SEMICONDUCTOR HAVING BASE LAYER INCLUDING GAN SUBSTRATE

TECHNICAL FIELD

The present invention relates to a layered semiconductor, a method for producing the layered semiconductor, and a method for producing a semiconductor device. More specifically, the present invention relates to a layered semiconductor including a semiconductor layer whose conductivity type is an n-type and which is made of GaN (gallium nitride), a method for producing the layered semiconductor, and a method for producing a semiconductor device.

BACKGROUND ART

Layered semiconductors including a semiconductor layer made of GaN and formed on a base layer can be used for production of semiconductor devices such as diodes and transistors. Various studies have been conducted on producing a semiconductor device using a layered semiconductor including a semiconductor layer made of GaN. For example, PTL 1 proposes a technique in which the fraction defective during cutting into chips in the production process of semiconductor devices is reduced by controlling the defect density of a substrate, thereby improving the yield of semiconductor devices produced.

CITATION LIST

Patent Literature

PTL 1: Japanese Unexamined Patent Application Publication No. 2009-164345

SUMMARY OF INVENTION

Technical Problem

As mentioned as an object in PTL 1, it is important to improve the yield of semiconductor devices produced. Accordingly, it is an object to provide a layered semiconductor capable of improving the yield of semiconductor devices produced, a method for producing the layered semiconductor, and a method for producing a semiconductor device.

Solution to Problem

A layered semiconductor according to the present invention includes a base layer including a substrate and a semiconductor layer which is disposed on the base layer and is made of GaN and whose conductivity type is an n-type. The semiconductor layer has an average n-type carrier concentration of $1.5 \times 10^{16}$ cm$^{-3}$ or less in a radial direction the substrate, and the difference between the maximum n-type carrier concentration of the semiconductor layer and the minimum n-type carrier concentration of the semiconductor layer is $1.5 \times 10^{15}$ cm$^{-3}$ or less.

A method for producing a layered semiconductor according to the present invention includes a step of providing a base layer including a substrate and a step of forming, on the base layer, a semiconductor layer which is made of GaN and whose conductivity type is an n-type. In the step of forming a semiconductor layer, the semiconductor layer is formed so as to have an average n-type carrier concentration of $1.5 \times 10^{16}$ cm$^{-3}$ or less in a radial direction of the substrate and so that the difference between the maximum n-type carrier concentration of the semiconductor layer and the minimum n-type carrier concentration of the semiconductor layer is $1.5 \times 10^{15}$ cm$^{-3}$ or less.

Advantageous Effects of Invention

According to the layered semiconductor and the method for producing a layered semiconductor, there can be provided a layered semiconductor capable of improving the yield of semiconductor devices produced and a method for producing the layered semiconductor.

DESCRIPTION OF EMBODIMENTS

Figure 1:
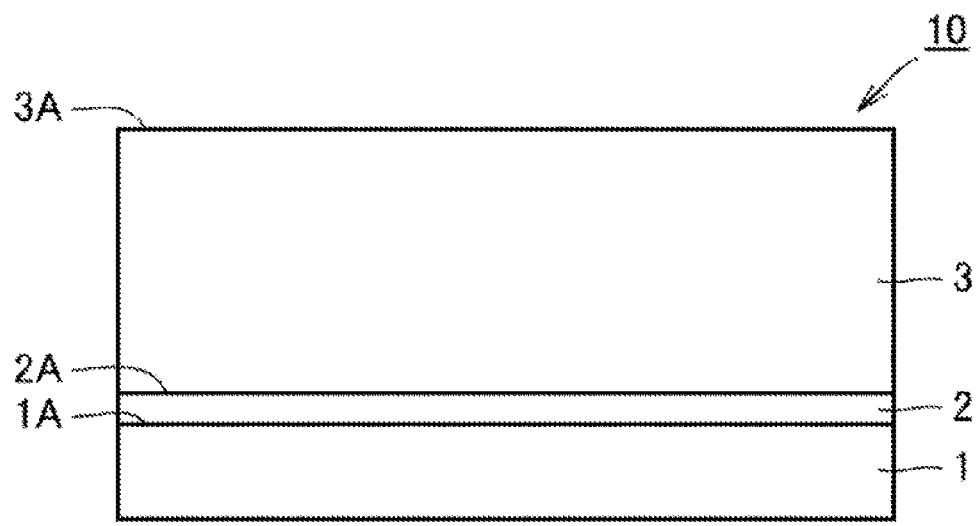
FIG. 1 is a schematic sectional view illustrating an example of a structure of a layered semiconductor.

Description of Embodiments a the Present Invention

First, embodiments of the present invention will be listed and described. A layered semiconductor according to an embodiment of the present invention includes a base layer including a substrate and a semiconductor layer which is disposed on the base layer and is made of GaN and whose conductivity type is an n-type. The semiconductor layer has an average n-type carrier concentration of $1.5 \times 10^{16}$ cm$^{-3}$ or less in a radial direction of the substrate, and the difference between the maximum n-type carrier concentration of the semiconductor layer and the minimum n-type carrier concentration of the semiconductor layer is $1.5 \times 10^{15}$ cm$^{-3}$ or less.

Such a layered semiconductor including a semiconductor layer formed on a base layer and made of GaN can be used for production of semiconductor devices such as diodes and transistors. An impurity element that generates majority carriers can be introduced into the semiconductor layer to impart a desired conductivity type. The impurity introduced may be an impurity (n-type impurity) that makes the conductivity typo of the semiconductor layer be an n-type. By introducing an n-type impurity, electrons (n-type carriers) serving as carriers are generated in the semiconductor layer. When the conductivity type of the semiconductor layer is set to be air n-type, electrons having higher mobility than holes serve as majority carriers, which can contribute to high-speed operation of semiconductor devices.

According to studies conducted by the present inventors, however, when the concentration of n-type carriers present in a semiconductor layer made of GaN is a predetermined value or less, such as $1.5 \times 10^{16}$ cm$^{-3}$ or less, the yield obtained when a semiconductor device is produced using a layered semiconductor may decrease. Specifically, for example, a Schottky barrier diode (SBD) employed when high-speed operation is required can be produced using a layered semiconductor including a semiconductor layer which is made of GaN and into which an n-type impurity is introduced. Herein, the semiconductor layer made of GaN is used as a drift layer of the SBD. To provide a sufficiently high breakdown voltage to the SBD, the concentration of n-type carriers included in the semiconductor layer serving as a drift layer needs to be low compared with the case of pn diodes. For example, the concentration needs to be $1.5 \times 10^{16}$ cm$^{-3}$ or less.

When an SBD is produced using such a layered semiconductor, the breakdown voltage, on-resistance, and the like of the SBD vary, which may decrease the yield. As a result of studies on the causes of and measures against this problem, it is found that the variation in n-type carrier concentration of the semiconductor layer in a radial direction of a substrate considerably affects the yield. That is, the decrease in the yield can be suppressed by considerably suppressing the variation (deference between the maximum n-type carrier concentration and the minimum n-type carrier concentration) in n-type carrier concentration in a radial direction of a substrate compared with the ease of a layered semiconductor used for production of pn diodes. Specifically, the yield can be improved by setting the difference between the maximum n-type carrier concentration of the semiconductor layer and the minimum n-type carrier concentration of the semiconductor layer in a radial direction of a substrate to be $1.5 \times 10^{15}$ cm$^{-3}$ or less.

In the layered semiconductor according to an embodiment of the present invention, the difference between the maximum n-type carrier concentration of the semiconductor layer and the minimum n-type carrier concentration of the semiconductor layer in a radial direction of the substrate is $1.5 \times 10^{15}$ cm$^{-3}$ or less. As a result, even if the average n-type carrier concentration of the semiconductor layer in the radial direction of the substrate is $1.5 \times 10^{16}$ cm$^{-3}$ or less, the yield can be improved in the production of the semiconductor device. According to the layered semiconductor of the present application, a layered semiconductor capable of improving the yield of semiconductor devices produced can be provided. Herein, the average, maximum, and minimum n-type carrier concentrations of the semiconductor layer in the radial direction of the substrate can be investigated by performing, for example, C-V (capacitance-voltage) measurement. The above-described average, maximum, and minimum n-type carrier concentrations in the radial direction of the substrate are respectively the arithmetic mean, maximum, and minimum of carrier concentrations measured at regular intervals in the radial direction from the center of the substrate in as region specified as 80% of the diameter of the substrate (i.e., in a region other than the peripheral region of the substrate, the peripheral region being specified as 10% of the diameter of the substrate from the end of the substrate).

In the layered semiconductor, the base layer may have a diameter of 74 mm or more (3 inches or more). This results in efficient production of semiconductor devices that use the layered semiconductor. To more efficiently produce semiconductor devices, the diameter of the base layer is preferably set to 99 mm or more (4 inches or more) and may be set to 127 mm or more (5 inches or more) or 150 mm or more (6 inches or more).

In the layered semiconductor, the semiconductor layer may be used as a drift layer of an SBD. When the semiconductor layer which is made of GaN and whose n-type carrier concentration is set to be low is used as a drift layer of an SBD, an SBD having a sufficiently high breakdown voltage can be easily produced.

A method for producing a layered semiconductor according to an embodiment of the present invention includes a step of providing a base layer including a substrate and a step of forming, on the base layer, a semiconductor layer which is made of GaN and whose conductivity type is an n-type. In the step of firming a semiconductor layer, the semiconductor layer is formed so as to have an average n-type carrier concentration of $1.5 \times 10^{16}$ cm$^{-3}$ or less in a radial direction of the substrate and so that the difference between the maximum n-type carrier concentration of the semiconductor layer and the minimum n-type carrier concentration of the semiconductor layer is $1.5 \times 10^{15}$ cm$^{-3}$ or less.

In the method for producing a layered semiconductor according to this embodiment, the semiconductor layer is formed so that the difference between the maximum n-type carrier concentration of the semiconductor layer and the minimum n-type carrier concentration of the semiconductor layer in the radial direction of the substrate is $1.5 \times 10^{15}$ cm$^{-3}$ or less. As a result, even if the average n-type carrier concentration of the semiconductor layer in the radial direction of the substrate is $1.5 \times 10^{16}$ cm$^{-3}$ or less, the yield can be improved in the production of the semiconductor device. According to the method for producing a layered semiconductor of the present application, a method for producing a layered semiconductor capable of improving the yield of semiconductor devices produced can be provided.

In the method for producing a layered semiconductor, the base layer provided in the step of providing a base layer may have a diameter of 74 mm or more (3 inches or more). This results in efficient production of semiconductor devices that use the layered semiconductor. To more efficiently produce semiconductor devices, the diameter of the base layer is preferably set to 99 mm or more (4 inches or more) and may be set to 127 mm or more (5 inches or more) or 150 mm or more (6 inches or more).

A method for producing a semiconductor device according to this embodiment includes a step of providing a layered semiconductor produced by the above method for producing a layered semiconductor and a step of forming an electrode on the layered semiconductor. According to the method for producing a semiconductor device of this embodiment, the yield can be improved by using a layered semiconductor produced by the above method for producing a layered semiconductor.

In the method for producing a semiconductor device, in the step of forming an electrode, the electrode may be formed so as to be in Schottky contact with the semiconductor layer. This allows production of semiconductor devices that use Schottky barrier, such as SBDs.

Details of Embodiments of the Present Invention

Next, a layered semiconductor, a method for producing the layered semiconductor, and a method for producing a semiconductor device according to embodiments of the present invention will be described below with reference to the attached drawings. In these drawings, the same or corresponding components are denoted by the same reference numerals and repetitive descriptions thereof are omitted.

Referring to FIG. 1, a layered semiconductor 10 according to this embodiment includes a substrate 1, a buffer layer 2, and a drift layer 3 serving as a semiconductor layer. The substrate 1 and the buffer layer 2 constitute a base layer according to this embodiment.

The substrate 1 may be made of, for example GaN. The substrate 1 may have a diameter of 55 mm or more, such as 3 inches. In order to improve the production efficiency and yield of semiconductor devices including the layered semiconductor 10, the diameter of the substrate 1 may be 80 mm or more (e.g., 4 inches), 105 mm or more (e.g., 5 inches), or 130 mm or more (e.g., 6 inches). When the substrate 1 is made of GaN, an n-type impurity such as oxygen (O) or silicon (Si) may be introduced into the substrate 1 so that the n-type carrier concentration is $1.0 \times 10^{17}$ cm$^{-3}$ or more and $5.0 \times 10^{18}$ cm$^{-3}$ or less. This sufficiently suppresses the resistance of the substrate generated when an electric current flows in a thickness direction of the substrate 1.

The buffer layer 2 is disposed so as to be in contact with a main surface 1A, which is one of main surfaces of the substrate 1. The buffer layer 2 is made of, for example, GaN. An n-type impurity such as O or Si may be introduced into the buffer layer 2 so that the n-type carrier concentration is $1.0 \times 10^{17}$ cm$^{-3}$ or more and $5.0 \times 10^{18}$ cm$^{-3}$ or less.

The drift layer 3 is disposed so as to be in contact with a main surface 2A of the buffer layer 2 located opposite to the surface that faces the substrate 1. The drift layer 3 is made of GaN, The conductivity type of the drift layer 3 is an n-type. The average n-type carrier concentration of the drift layer 3 in a radial direction of the substrate 1 (in a direction parallel to a main surface 3A of the drift layer 3) is $1.5 \times 10^{16}$ cm$^{-3}$ or less, and the difference between the maximum n-type carrier concentration and the minimum n-type carrier concentration is $1.5 \times 10^{15}$ cm$^{-3}$ or less. The n-type impurity contained in the drift layer 3 may be, for example, O or Si. In the case where the average n-type carrier concentration of the drift layer 3 in the radial direction of the substrate 1 is $1.0 \times 10^{16}$ cm$^{-3}$ or less, for example, when an SBD is produced using the layered semiconductor 10, the breakdown voltage can be more easily improved. In the case where the average n-type carrier concentration is $4.0 \times 10^{15}$ cm$^{-3}$ or more, for example, when an SBD is produced, allowable on-resistance can be easily achieved. When the average n-type carrier concentration is within the above range, the yield can be improved with more certainty by controlling the variation in the n-type carrier concentration within the above range. To achieve higher yield, the difference between the maximum n-type carrier concentration and the minimum n-type carrier concentration is preferably $2.5 \times 10^{14}$ cm$^{-3}$ or less.

Figure 2:
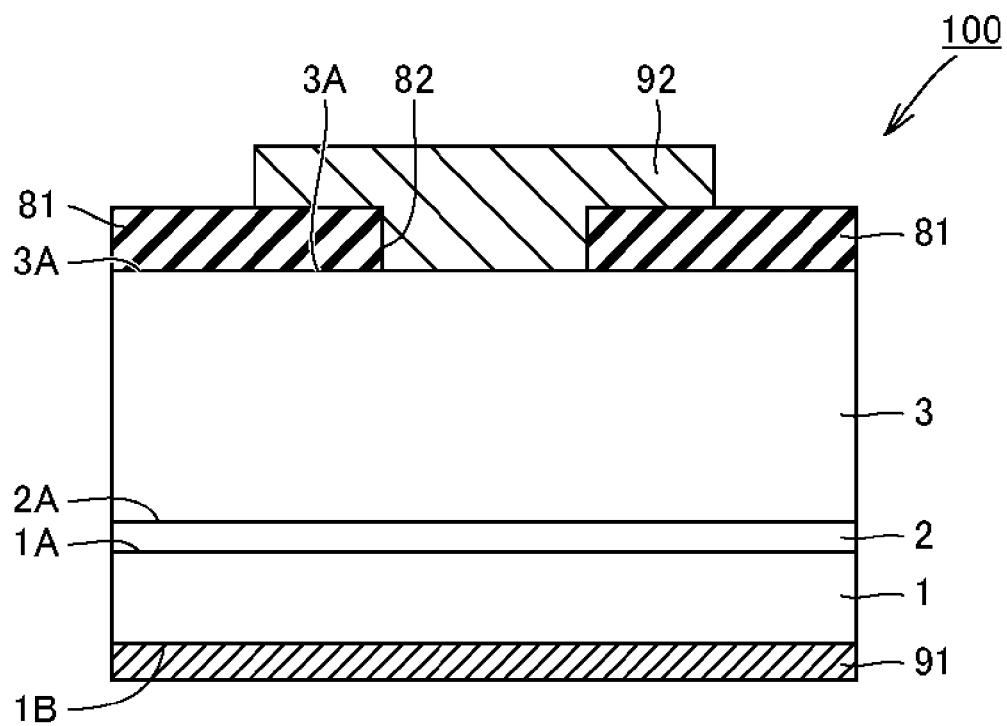
FIG. 2 is a schematic sectional view illustrating an example of a structure of a Schottky barrier diode (SBD).

Next, a Schottky barrier diode (SBD) which is an example of a semiconductor device produced using the layered semiconductor 10 will be described. Referring to FIG. 2, an SBD 100 according to this embodiment is produced using the layered semiconductor 10 according to the above embodiment, and includes a substrate 1, a buffer layer 2, and a drift layer 3 stacked like the layered semiconductor 10. The SBD 100 further includes an insulating layer 81, an ohmic electrode 91, and a Schottky electrode 92.

The ohmic electrode 91 is disposed so as to be in contact with a main surface 1B of the substrate 1 located opposite to the surface that faces the buffer layer 2. The ohmic electrode 91 is made of a metal, such as Ti (titanium), capable of being in ohmic contact with the substrate 1.

The insulating layer 81 is disposed so as to be in contact with a main surface 3A of the drift layer 3 located opposite to the surface that faces the buffer layer 2. The insulating layer 81 is formed of an insulator made of, for example, silicon nitride or silicon oxide. An opening 82 is formed so as to penetrate the insulating layer 81 in a thickness direction of the insulating layer 81. In this opening 82, the main surface 3A of the drift layer 3 is exposed.

The Schottky electrode 92 is disposed so as to fill the opening 82 of the insulating layer 81. More specifically, the Schottky electrode 92 is disposed so as to be in contact with the main surface 3A of the drift layer 3 exposed at the opening 82 and a sidewall surface defined by the opening 82 and so as to extend to an upper surface (a main surface of the insulating layer 81 located opposite to the surf lice that faces the drift layer 3) of the insulating layer 81 while being in contact with the insulating layer 81. The Schottky electrode 92 is made of a metal, such as Ni (nickel), capable of being in Schottky contact with the drift layer 3 made of GaN.

When a forward voltage is applied to the SBD 100, an electric current flows between the Schottky electrode 92 and the ohmic electrode 91 through the substrate 1, the buffer layer 2, and the drift layer 3. When a reverse voltage is applied to the SBD 100, a depletion layer is formed in the drift layer 3 so as to include a region in contact with the Schottky electrode 92 in the drift layer 3. Therefore, an electric current does not flow.

Next, methods for producing the layered semiconductor 10 and the SBD 100 according to this embodiment will be roughly described.

Figure 3:
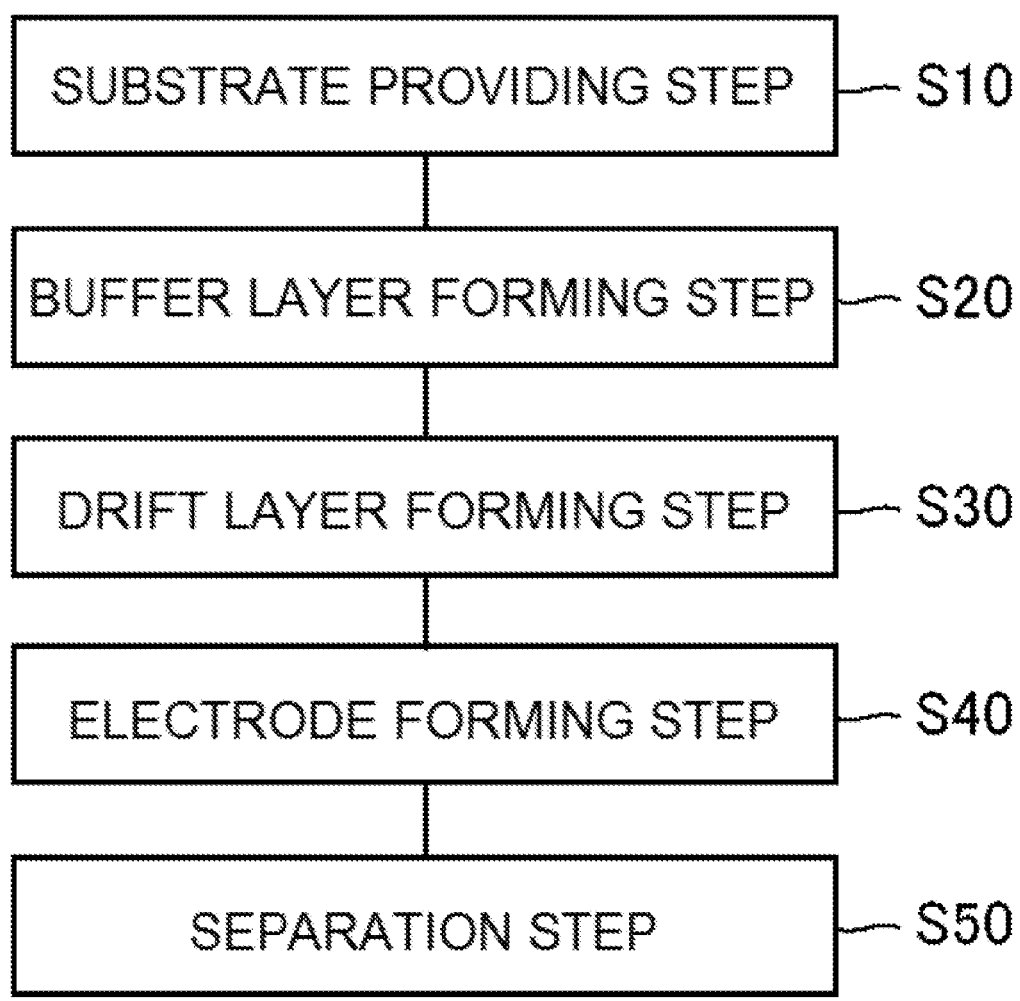
FIG. 3 is a flowchart roughly illustrating methods for producing a layered semiconductor and an SBD.
Figure 4:
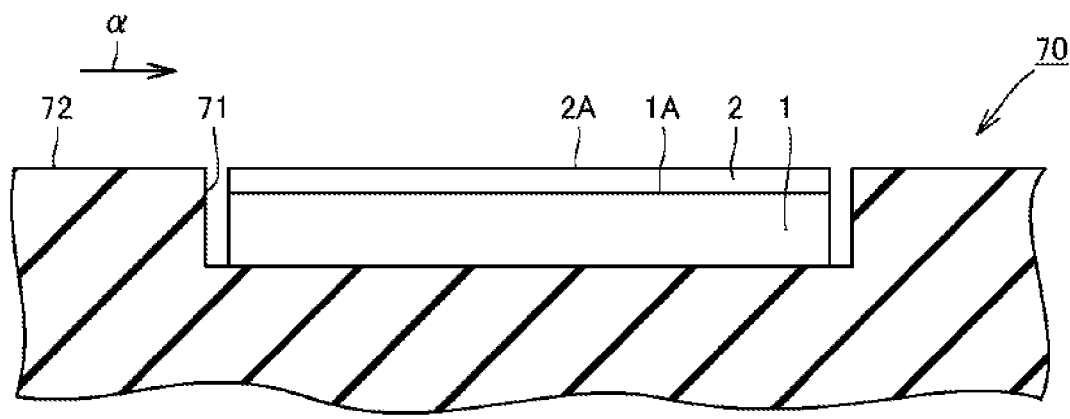
FIG. 4 is a schematic sectional view for describing an example of methods for producing a layered semiconductor and an SBD.

Referring to FIG. 3, in the methods for producing the layered semiconductor 10 and the SBD 100 according to this embodiment, first, a substrate providing step is performed as a step (S10). In the step (S10), as illustrated in FIG. 4, a substrate 1 made of GaN and having a diameter of, for example, 4 inches (101.6 mm) is provided. More specifically, a substrate 1 made of GaN is provided by slicing a GaN ingot. After the surface of the substrate 1 is polished, a process such as cleaning is performed to provide a substrate 1 whose main surface 1A is flat and clean.

Subsequently, a buffer layer forming step is performed as a step (S20). In the step (S20), a buffer layer 2 is formed on the main surface 1A of the substrate 1 provided in the step (S10). The buffer layer 2 can be formed as follows. Referring to FIG. 4, the substrate 1 provided in the step (S10) is placed in a recess 71 serving as a holding portion formed in a susceptor 70. Then, a source gas (e.g., trimethylgallium) is caused to flow in a direction indicated by an arrow α to supply the source gas to the main surface 1A of the substrate 1 while the temperature of the substrate held in the recess 71 is appropriately kept. As a result, the buffer layer 2 is formed on the main surface 1A through epitaxial growth. Herein, an n-type impurity such as Si can be introduced into the buffer layer 2 by adding an appropriate gas (e.g., silane) to the source gas. Through the steps (S10) and (S20), a base layer constituted by the substrate 1 and the buffer layer 2 is provided.

Subsequently, a drift layer forming step is performed as a step (S30). In the step (S30), a drift layer 3 which is made of GaN and whose conductivity type is an n-type is formed so as to be in contact with the buffer layer 2 formed in the step (S20). Referring to FIG. 1, the drift layer 3 is formed so that the average n-type carrier concentration in the radial direction of the substrate 1 is $1.5 \times 10^{16}$ cm$^{-3}$ or less and the difference between the maximum n-type carrier concentration and the minimum n-type carrier concentration is $1.5 \times 10^{15}$ cm$^{-3}$ or less. The drift layer 3 can be formed in the same apparatus after the step (S20). Specifically, referring to FIG. 4, a source gas such as trimethylgallium is caused to flow in a direction indicated by an arrow α (in a direction parallel to an upper surface 72 of the susceptor 70, that is, a surface in a region other than the recess 71) to supply the source gas to the main surface 2A (main surface of the base layer) of the buffer layer 2 while the base layer constituted by the substrate 1 and the buffer layer 2 is held in the recess 71 of the susceptor 70. Thus, the drift layer 3 is formed on the main surface 2A through epitaxial growth. Herein, an n-type impurity such as Si can be introduced into the drill layer 3 by adding an appropriate gas (e.g., silane) to the source gas. Furthermore, the variation in the n-type carrier concentration in the radial direction of the substrate 1, that is, the difference between the maximum n-type carrier concentration and the minimum n-type carrier concentration can be controlled to $1.5 \times 10^{15}$ cm$^{-3}$ or less by appropriately adjusting the flow rate and flow velocity of gases such as the source gas and the temperature of the base layer constituted by the substrate 1 and the buffer layer 2 and also by suppressing generation of turbulent flows of gases such as the source gas. The generation of turbulent flows of gases can be suppressed by controlling the difference in level between the main surface 2A (main surface of the base layer) of the buffer layer 2 and the upper surface 72 of the susceptor 70. Specifically, when the upward direction relative to the upper surface 72 of the susceptor 70 is assumed to be positive and the downward direction relative to the upper surface 72 is assumed to be negative, the difference in level between the main surface 2A of the buffer layer 2 and the upper surface 72 of the susceptor 70 is preferably in the range of −0.1 mm to 0 mm and more preferably in the range of −0.075 mm to −0.025 mm. When the difference in level between the main surface 2A of the buffer layer 2 and the upper surface 72 of the susceptor 70 is controlled within the above range, the generation of turbulent flows of gases such as the source gas can be effectively suppressed. As a result, the variation in the n-type carrier concentration in the radial direction of the substrate 1, that is, the difference between the maximum n-type carrier concentration and the minimum n-type carrier concentration can be controlled to $1.5 \times 10^{16}$ cm$^{-3}$ or less with certainty. Through the above processes, a layered semiconductor 10 according to this embodiment is completed.

Subsequently, an electrode forming step is performed as a step (S40). In the step (S40), an ohmic electrode 91, an insulating layer 81, and a Schottky electrode 92 are formed on the layered semiconductor 10 provided through the steps (S10) to (S30). Specifically, an insulating layer 81 formed of an insulator made of, for example, silicon oxide or silicon nitride is formed by CVD (chemical vapor deposition) or the like. The insulating layer 81 is formed so as to cover the main surface 3A of the drift layer 3. Then, a mask having an opening at a position corresponding to a region in which an opening 82 is to be formed is formed on the insulating layer 81. The insulating layer 81 is etched using the mask to form an opening 82. A Schottky electrode 92 made of a metal, such as Ni, capable of being in Schottky contact with GaN for the drift layer 3 is then formed by vapor deposition or the like so as to fill the opening 82. An ohmic electrode 91 made of a metal, such as Ti, capable of being in ohmic contact with the substrate 1 is formed by vapor deposition or the like so as to be in contact with the main surface 1B of the substrate 1 located opposite to the surface that faces the buffer layer 2. In the step (S40), after a metal layer to serve as an electrode is formed, the metal layer may be heat-treated at an appropriate temperature.

Subsequently, a separation step is performed as a step (S50). In the step (S50), the layered semiconductor on which the insulating layer 81, the Schottky electrode 92, and the ohmic electrode 91 have been formed is separated into individual elements by dicing or the like. Through the above processes, an SBD 100 according to this embodiment is completed (refer to FIG. 2).

A layered semiconductor 10 in which the difference between the maximum n-type carrier concentration of the drift layer 3 and the minimum n-type carrier concentration of the drift layer 3 in the radial direction of the substrate 1 is $1.5 \times 10^{15}$ cm$^{-3}$ or less is produced through the steps (S10) to (S30) according to this embodiment. Then, electrodes and the like are formed on the layered semiconductor 10 through the step (S40). The layered semiconductor 10 is separated into individual elements through the step (S50) to produce SBDs 100 serving as semiconductor devices. As described above, when the difference between the maximum n-type carrier concentration of the drift layer 3 and the minimum n-type carrier concentration of the drift layer 3 in the radial direction of the substrate 1 is controlled to $1.5 \times 10^{15}$ cm$^{-3}$ or less, even it the average n-type carrier concentration of the drift layer 3 in the radial direction of the substrate 1 is $1.5 \times 10^{16}$ cm$^{-3}$ or less, the yield can be improved in the production of the SBD 100.

EXAMPLES

An experiment was conducted to check the relationship between the variation in the n-type carrier concentration of a semiconductor layer in a radial direction of a substrate (the difference between the maximum n-type carrier concentration and the minimum n-type carrier concentration) and the yield of semiconductor devices produced. The procedure of the experiment is as follows.

Figure 5:
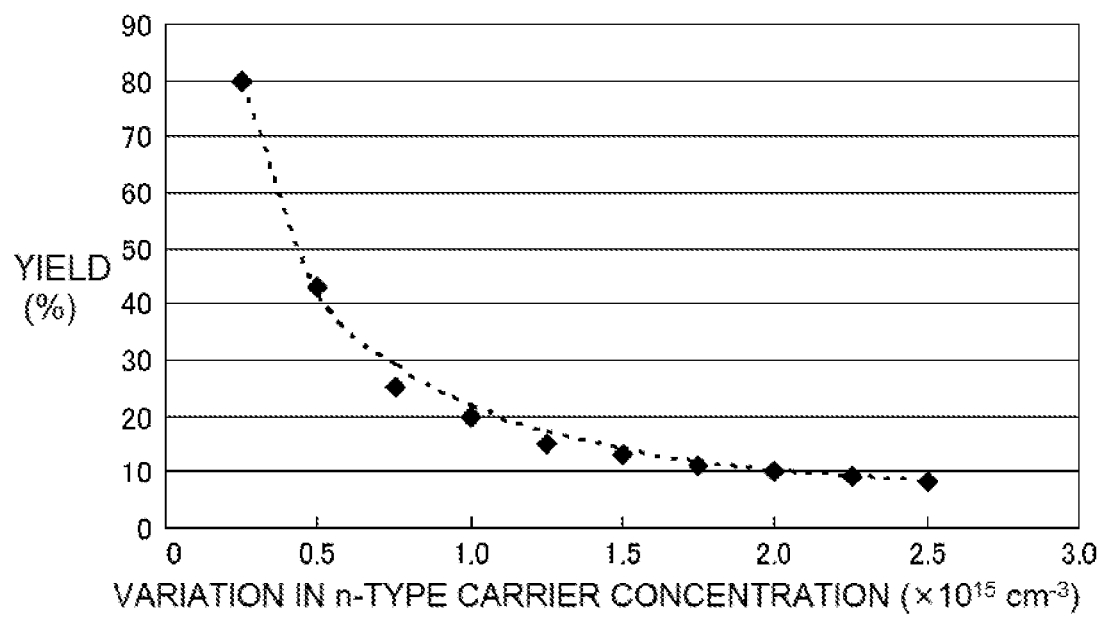
FIG. 5 illustrates the relationship between variation in n-type carrier concentration and yield.

First, a layered semiconductor 10 having the same structure as in the above embodiment was provided (refer to FIG. 1). Specifically, a substrate 1 having an n-type carrier concentration $2.5 \times 10^{18}$ cm$^{-3}$ and a diameter of 4 inches and made of GaN with a (0001) Ga face was provided by introducing Si or O (oxygen) serving as an n-type impurity. A buffer layer 2 having an n-type carrier concentration of $1.0 \times 10^{18}$ cm$^{-3}$ was formed on the substrate 1 by introducing Si serving as an n-type impurity. A drift layer 3 which is a semiconductor layer containing Si serving as an n-type impurity was limiter formed on the butler layer 2. Thus, a layered semiconductor 10 illustrated in FIG. 1 was obtained. Herein, the average n-type carrier concentration of the drift layer 3 in the radial direction of the substrate 1 was $5 \times 10^{15}$ cm$^{-3}$. A plurality of layered semiconductors 10 having different variations (differences between the maximum n-type carrier concentration and the minimum n-type carrier concentration) in the n-type carrier concentration of the drift layer 3 in the radial direction of the substrate 1 were obtained by changing the crystal growth conditions during formation of the drill layer 3. Herein, the n-type carrier concentration of the drift layer 3 was determined by C-V measurement (measured point area: 200 μm in diameter). That is, five n-type carrier concentrations of the drift layer 3 were measured at intervals of 10 mm in the radial direction from the center of the substrate in a region other than the peripheral region (10 mm) of the substrate 1, and the average, maximum, and minimum of the n-type carrier concentrations were calculated. Furthermore, electrodes and the like were formed on the obtained layered semiconductor 10 to produce an SBD 100 having the structure illustrated in FIG. 2. The yield of the SBDs 100 produced from the layered semiconductors 10 having different variations in the n-type carrier concentration was measured. The yield was determined from the ratio of the number of SBDs 100 that satisfied the conditions of a leak current of 0.01 mA or less at a reverse voltage of 600 V, which was an allowable design value, and a resistance of 5 A/1.5 V during application of a forward voltage to the number of SBDs 100 produced from the layered semiconductors 10. FIG. 5 illustrates the experimental results.

In FIG. 5, the horizontal axis shows the variation (the difference between the maximum n-type carrier concentration and the minimum n-type carrier concentration) in the n-type carrier concentration of the drift layer 3 in the radial direction of the substrate 1. The vertical axis shows the yield obtained when the SBDs 100 were produced from the layered semiconductors 10. Referring to FIG. 5, the yield improves as the variation in the n-type carrier concentration decreases. In a region where the variation is $1.5 \times 10^{15}$ cm$^{-3}$ or less, the yield improves sharply. When the variation is controlled to $0.5 \times 10^{15}$ cm$^{-3}$ or less ($5 \times 10^{14}$ cm$^{-3}$ or less), a yield of 40% or more is achieved. Furthermore, when the variation is controlled to $0.25 \times 10^{15}$ cm$^{-3}$ or less ($2.5 \times 10^{14}$ cm$^{-3}$ or less), a yield of 80% or more is achieved. It is clear from the experimental results that in order to improve the yield of semiconductor devices produced, the difference between the maximum n-type carrier concentration of a semiconductor layer and the minimum n-type carrier concentration of the semiconductor layer in the radial direction of a substrate needs to be $1.5 \times 10^{15}$ cm$^{-3}$ or less, and is preferably $5 \times 10^{14}$ cm$^{-3}$ or less and more preferably $2.5 \times 10^{14}$ cm$^{-3}$ or less.

The embodiments and Examples disclosed herein are mere examples in all respects and should be understood as being non-limitative in any perspective. The scope of the present invention is defined not by the above description but by Claims. The scope of the present invention is intended to embrace all the modifications within the meaning and range of equivalency of the Claims.

INDUSTRIAL APPLICABILITY

In particular, the layered semiconductor, the method for producing a layered semiconductor, and the method for producing a semiconductor device according to the present application are advantageously applicable to a layered semiconductor including a semiconductor layer whose conductivity type is an n-type and which is made of GaN and a method for producing the layered semiconductor, and a method for producing a semiconductor device including a semiconductor layer made of GaN.

REFERENCE SIGNS LIST 1 substrate
1A main surface of substrate
1B another main surface of substrate
2 buffer layer
2A main surface of buffer layer
3 drift layer
3A main surface of drift layer
10 layered semiconductor
70 susceptor
71 recess
72 upper surface of susceptor
81 insulating layer
82 opening
91 ohmic electrode
92 Schottky electrode

The invention claimed is:

1. A layered semiconductor comprising:
   a base layer including a GaN substrate; and
   a semiconductor layer which is disposed on the base layer and is made of GaN and whose conductivity type is an n-type,
   wherein the semiconductor layer has an average n-type carrier concentration of $4.0 \times 10^{15}$ cm$^{-3}$ or more and $1.5 \times 10^{16}$ cm' or less in a radial direction of the substrate, and a difference between a maximum n-type carrier concentration of the semiconductor layer and a minimum n-type carrier concentration of the semiconductor layer is $1.5 \times 10^{15}$ cm' or less.

2. The layered semiconductor according to claim 1, wherein the base layer has a diameter of 74 mm or more.

3. The layered semiconductor according to claim 1, wherein the semiconductor layer is used as a drift layer of a Schottky barrier diode.

* * * * *

UNITED STATES PATENT AND TRADEMARK OFFICE
CERTIFICATE OF CORRECTION

PATENT NO.       : 9,825,134 B2
APPLICATION NO.  : 15/315523
DATED            : November 21, 2017
INVENTOR(S)      : Fuminori Matsuhashi et al.

Page 1 of 1

It is certified that error appears in the above-identified patent and that said Letters Patent is hereby corrected as shown below:

- In Claim 1, Column 10, Line 31, "cm'" should be -- $cm^{-3}$ --

- In Claim 1, Column 10, Line 34, "cm'" should be -- $cm^{-3}$ --

Signed and Sealed this
Thirteenth Day of March, 2018

Andrei Iancu
*Director of the United States Patent and Trademark Office*